United States Patent [19]

Helderman et al.

[11] 4,331,476
[45] May 25, 1982

[54] SPUTTERING TARGETS WITH LOW MOBILE ION CONTAMINATION

[75] Inventors: Earl R. Helderman, Hillsboro; Robert R. Zimmerman, Beaverton, both of Oreg.

[73] Assignee: Tektronix, Inc., Beaverton, Oreg.

[21] Appl. No.: 117,328

[22] Filed: Jan. 31, 1980

[51] Int. Cl.³ .............................................. B22F 3/12
[52] U.S. Cl. ........................................ 75/214; 75/225; 75/248
[58] Field of Search ................. 75/225, 214, 248; 204/192 R, 298

[56] References Cited

U.S. PATENT DOCUMENTS

| | | | |
|---|---|---|---|
| 1,719,128 | 7/1929 | Reeve | 75/225 |
| 1,731,244 | 10/1929 | Gero | 75/248 |
| 3,116,146 | 12/1963 | Gatti | 75/248 |
| 3,300,285 | 1/1967 | Pugh | 75/248 |
| 3,700,434 | 10/1972 | Abkowitz | 75/225 |
| 3,793,014 | 2/1974 | Rosenwasser | 75/225 |
| 3,963,485 | 6/1976 | Thellmann | 75/225 |
| 4,135,286 | 1/1979 | Wright | 75/226 |

FOREIGN PATENT DOCUMENTS 450552 7/1936 United Kingdom ................. 75/248

Primary Examiner—Brooks H. Hunt
Assistant Examiner—J. J. Zimmerman
Attorney, Agent, or Firm—John D. Winkelman

[57] ABSTRACT

Metallic sputtering targets having minimal mobile ion contamination are produced by forming a compacted slab of particles of the constituent metal(s) in an isostatic pressing operation. The slab is then transferred to a heat resistant support faced with a material, such as alumina, that is inert at high temperatures. Next, the supported slab is placed in a vacuum oven and heated to a temperature sufficient to bond the metal particles together and volatilize mobile ion contaminants. The sintered slab is usable as a cathodic sputtering target with minimal additional treatment. The level of mobile ion contaminants in the completed target may be monitored by fabricating an MOS capacitor using the target, plotting its capacitance versus applied voltage over a suitable range, then measuring the extent to which the plot shifts after a high temperature-positive bias stress treatment.

7 Claims, 4 Drawing Figures

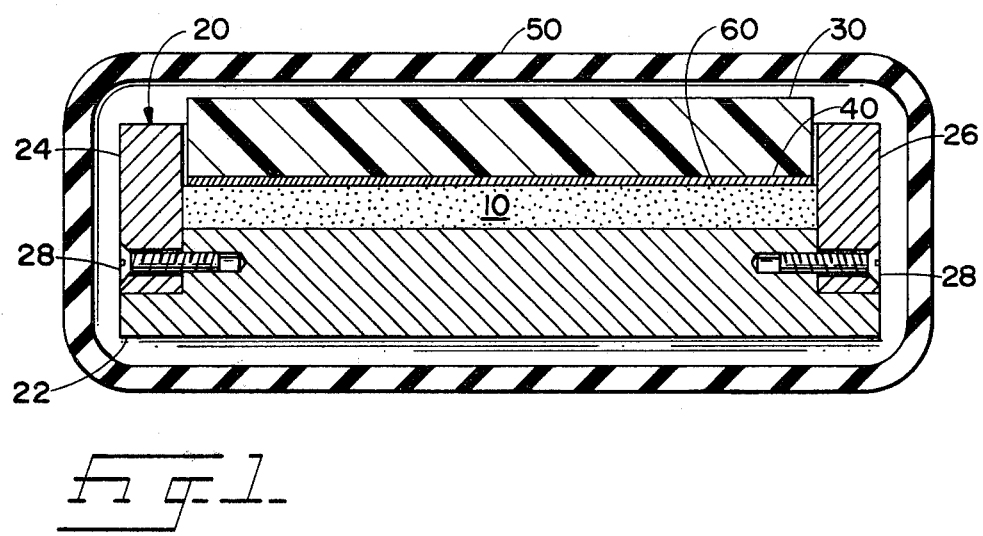
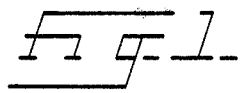
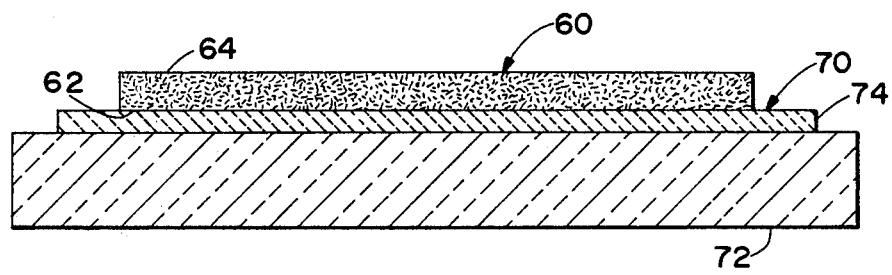

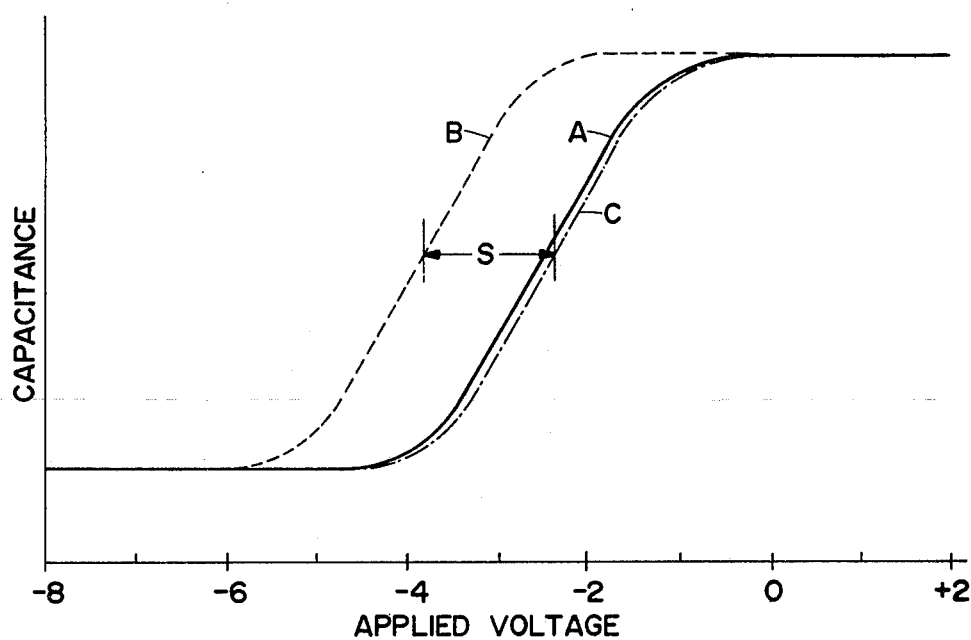
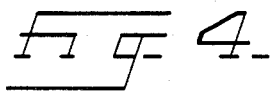
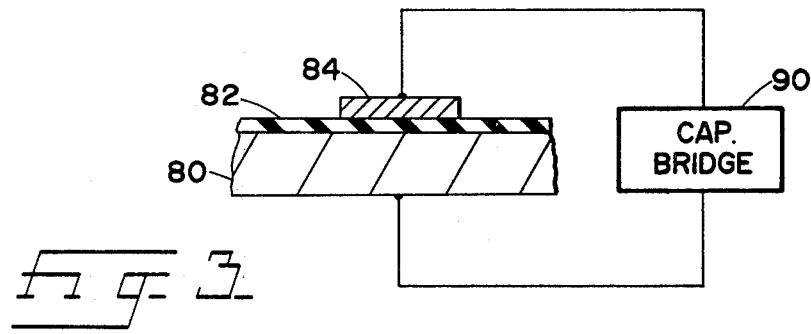

SPUTTERING TARGETS WITH LOW MOBILE ION CONTAMINATION

BACKGROUND AND OBJECTS OF THE INVENTION

The present invention is concerned with the provision of cathode sputtering targets having low concentrations of mobile ion contaminants, such as sodium and other alkali metals.

In the fabrication of microelectronic integrated circuits, component inteconnections typically are formed from thin deposited metal films. A variety of procedures has been employed to deposit microcircuit metallization layers, but vacuum evaporation and cathode sputtering are the ones most commonly used at present. Cathode sputtering, the older of the two methods, is particularly suitable for depositing alloys and highly refractory metals.

Techniques for depositing materials by cathode sputtering are well known. A cathode target formed of the material to be sputtered is subjected to intense bombardment by gas ions in a low pressure environment. Atoms of the cathode material are physically dislodged by the bombardment and diffuse through the gas to deposit as a film on a substrate placed in their path. A potential of about 2 to 5 kV typically is applied between the cathode and a nearby anode, which may be used to support the substrate to be coated. The resulting electric field between the anode and cathode accelerates the ions and causes them to bombard the exposed surface of the cathode. In some types of sputtering equipment, a magnetic field is utilized in to enhance the deposition rate. Apparatus of the latter type, generally referred to as magnetron-type systems, is described in *The Review of Scientific Instruments*, Vol. 40, No. 5, pp. 693–697 (1969) and U.S. Pat. No. 4,166,018 to Chapin.

In modern, commercially available magnetron-type sputtering systems, the cathode target usually is a flat plate formed of the material to be sputtered. The plate is attached in some suitable manner to a carrier or support that conducts process-generated heat to a circulated liquid coolant. Target plates are formed in a variety of ways, depending on the material involved. For example, targets of palladium or nickel-chromium alloy may be vacuum cast from the molten metal. Titanium-tungsten (Ti-W) targets are produced by sintering particles of the constituent metals together in a graphite mold using a hot-pressing procedure. Zinc oxide targets can be made by pressing the powdered material into a mold of the desired configuration.

As is generally appreciated, contamination must be avoided at every stage in an integrated circuit manufacturing process if performance and yield goals are to be achieved. This is particularly true in the case of circuits built using MOS (metal-oxide-semiconductor) technologies and those designed for high voltage or high speed applications. The need to control contamination of course extends to the metal thin-films that are deposited in the metallization process. In this connection, it has been determined that certain, "mobile" ions, such as sodium, are particularly deleterious and that metal films deposited directly on silicon dioxide insulating layers should have a very low concentration of mobile ion contaminants. Problems caused by mobile ion contamination include the creation of unwanted leakage paths and short-circuiting of isolation diffusions in bipolar devices, and the degradation of low current beta in lateral PNP and NPN transistors. In addition, mobile contaminants produce shifts in the gate threshold voltages of MOS transistors and instabilities in the breakdown potentials of high voltage devices. Mobile ion contamination may, of course, result from a lack of cleanliness in the IC fabrication process. However, it cannot be eliminated or reduced to an inconsequential level unless the materials used to manufacture the circuits are of sufficient purity themselves. As already noted, metal thin-films that contact silicon dioxide insulating layers should have a very low level of mobile ion contaminants.

Sputtering targets with sufficiently low concentrations of mobile ion contaminants, sodium in particular, have not been commercially available for certain desireable metal systems. For example, gold is a preferred contact metal in some integrated circuit applications, but it does not adhere well to silicon dioxide and an intermediate bonding metal layer must be used. An alloy of titanium and tungsten (10% Ti—90% W by weight) forms excellent bonding layers with silicon dioxide and is a good barrier metal, but commercially available Ti-W sputtering targets have been found to contain excessive concentrations of sodium. Accordingly, one object of the present invention is to provide Ti-W targets having low concentrations of sodium.

A more general object of the invention is to provide a method for producing sputtering targets with reduced levels of mobile ion contaminants.

Another object of the invention is to provide a method for reducing the concentration of mobile ion contaminants in sputtering targets.

Still another object of the invention is to provide a method for fabricating planar sputtering targets that are usable with a minimum of machining.

A further object is to provide a method of making planar sputtering targets by a combination of low temperature pressing and high temperature vacuum sintering.

These and other objects, features and advantages of the present invention will be apparent as the following detailed description is read in conjunction with the accompanying drawings.

BRIEF DESCRIPTION OF THE DRAWINGS

FIG. 1 is a sectional view of apparatus for forming a plate-like target billet in an isostatic press, FIG. 2 is a similar view of apparatus used in sintering the target billet;

FIG. 3 is a simplified representation of one step in a testing procedure for deposited metal films; and FIG. 4 is a C:V plot produced by the FIG. 3 step.

DESCRIPTION OF PREFERRED EMBODIMENT

Thin films of titanium-tungsten have known utility as adhesion and barrier layers in multilayer metallization systems. However, as already noted, commercially available Ti-W sputtering targets frequently are contaminated with sodium. A portion of the sodium is deposited with the metal alloy, and migrates into silicon dioxide insulating layers onto which the metal film is sputtered. The adverse effects of excessive mobile ion concentrations in such layers have been described above. The provision of Ti-W targets having low levels of sodium and other mobile ion contaminants thus is a specific object of the present invention, and the following description of a preferred embodiment will be addressed to the fabrication of such targets.

The manufacture of a Ti-W sputtering target with low mobile ion contamination begins with the formation of a compacted slab, or tile, composed of titanium and tungsten particles. Referring to FIG. 1, a charge 10 of particles previously blended in the desired ratio—i.e., 10% of titanium, 90% tungsten—is poured into the cavity of an open face mold 20 of appropriate (herein rectangular) configuration. Mold 20 includes a baseplate 22, opposed side plates 24, 26 removably attached to the baseplate with fasteners 28, and opposed similarly-attached end plates (not shown).

The preferred starting material is a blend of tungsten particles 3-6 microns in diameter and titanium particles that will pass through a 100 mesh screen. The metals should be of the highest purity commercially available, and the titanium particles preferably should be formed of material produced by the magnesium reduction process.

After leveling the particles, the mold is closed by means of a relatively flexible plug 30 placed on top of the charge. The plug suitably consists of a nylon or Delrin plate, herein about 0.5 in. (13 mm) thick, sized to fit closely but freely within the open mouth of mold 20. If desired, a thin—e.g., about 0.010-0.020 in. (0.25-0.50 mm)—metal shim 40 may be situated between the metal particles and plug 30 to protect the latter's relatively soft surface. The charged mold assembly next is sealed within a rubber "boot" 50 and submerged in the liquid-filled pressure chamber of an isostatic press (not shown). There the assembly is subjected to sufficient hydraulic pressure to compact particle charge 10 into a coherent mass. A pressure of about 13,000 p.s.i. has proved to be suitable and results in a tile of about 50% density. The pressing operation is performed at ambient, or "room" temperature.

After the pressing step, the mold assembly is removed from boot 50, and plug 30 and shim 40 (if used) are carefully lifted off the compacted charge. Finally, the sides of the mold—i.e., side plates 24, 26 and the end plates—are detached from baseplate 22. The Ti-W tile consists at this stage of a pressure-formed slab of particles that are cohered but not bonded to one another. Accordingly, the tile is relatively fragile and care must be taken not to damage it.

Formation of the sputtering target proceeds with the densification of the tile using a vacuum sintering process. Referring now to FIG. 2, the pressure-compacted tile 60 is transferred from the mold baseplate to a heat resistant support 70 suitably formed of a graphite plate 72 supporting a flat sheet 74 of alumina. The tile-bearing support then is placed in a vacuum oven (not shown) and heated to a temperature sufficient to fuse the metal particles together and volatilize mobile ion contaminants. A preferred procedure is to reduce the pressure in the oven to about $10^{-6}$ torr, then raise the temperature to about 1250° C. while maintaining the vacuum. After four to six hours at 1250° C., the temperature is increased to 1350°-1400° C. for an additional one-half hour, then reduced to room temperature. Mobile ion contaminants, sodium in particular, are volatilized by the high temperature vacuum bake, while at the same time tile 60 becomes a densified, sintered mass that can be used as a sputtering target with only a minimum of additional processing.

As will be understood, the sintering procedure results in a shrinkage of tile 60 as the particles fuse together into a dense mass. However, because the tile is supported on the flat, upper surface of alumina sheet 74, but is otherwise unconstrained, the flatness of the tile is maintained as it contracts during the heat exposure. The alumina sheet, which is essentially inert at the sintering temperature, prevents the metal tile from reacting with the graphite supporting plate. Tiles made using the just-described procedure have a number of advantages: (1) a significant reduction in the concentration of mobile ion contaminants compared to that of the starting material; (2) a substantially uniform density as a result of using a relatively flexible pressure platen (plug 30) and applying pressure to the platen in an isostatic pressure chamber; (3) a flat bonding surface 62 usable without additional machining or other mechanical treatment; (4) a substantially flat sputtering surface 64 usable as processed; (5) an absence of carbides or other mold surface reaction products; and (6) a minimum of waste material, since the mold can be sized to yield tiles that after sintering are close to the desired final size.

As noted above, sputtered metal films deposited directly on silicon dioxide insulating layers should have a very low level of mobile ion contaminants. MOS devices are particularly sensitive in this respect. Accordingly, the following method provides an effective way to measure the relative level of mobile ion contaminants in a sputtering target.

Referring to FIG. 3, a clean silicon wafer 80 is oxidized to provide a sodium-free $SiO_2$ layer 82 about 1000 angstroms thick on its upper surface. A deposit 84 of the metal to be tested is then applied to oxide layer 82 by sputtering. As will be understood, the size and shape of deposit 84 are arbitrarily chosen, but should remain unchanged from one test specimen to another. After annealing the wafer in an inert atmosphere ($N_2$) at 300° C. to remove any radiation damage caused by the sputtering, a plot is made of the deposit (84)-to-wafer (80) capacitance at applied voltages within the range of $+2$ V to $-8$ V using a suitable measuring device 90. An initial C:V plot for an N-type wafer 80 is depicted in FIG. 4 by a solid line A.

Next, the test specimen is placed in an oven at 200° C. for a period of 10 minutes with a $+5$ V bias applied to deposit 84. A second C:V plot is made following this high temperature-positive bias stress exposure, the result being shown by a dashed line B in FIG. 4. Finally, the specimen is again placed in an oven and the temperature increased briefly to 200° C. with a $-5$ V bias applied to the sputtered metal deposit. A final C:V plot, which is indicated in the graph by a dot-dash line C, is then recorded after the wafer has cooled.

The amount of mobile ion contamination in metal deposit 84 is indicated by the voltage shift S measured between plots B and C. As will be seen, the difference between plots A and C generally is not very great. Thus, if less accurate results are acceptable the negative bias stress step can be eliminated. The degree of C:V shift that can be tolerated will, of course, depend on the type of circuit structure in which the metal film will be used, etc. By way of example, however, Ti-W sputtering targets exhibiting a C:V shift of 2 volts or less as measured by the just-described procedure are considered acceptable for use in producing high performance bipolar circuits.

While the best mode presently contemplated for practicing the invention has been set forth, it will be appreciated that various changes and modifications are possible within the ambit of the above teachings. It is therefore to be understood that the true scope of the invention is limited only as required by the express terms of the appended claims.

We claim:

1. A method of manufacturing a sintered metal alloy sputtering target consisting essentially of titanium and tungsten and having a reduced level of sodium and other alkali metal contamination, comprising the subsequential steps of:
   (a) providing a die having a cavity of a desired configuration, said cavity having a relatively flexible movable wall section,
   (b) charging said cavity with a suitable quantity of a titanium and tungsten particle mixture containing an undesirably high level of alkali metal contamination, including sodium,
   (c) compacting said mixture into a coherent mass by the application of substantially uniform surface pressure to said movable wall section,
   (d) transferring the compacted particle mass to a temperature-resistant support, and
   (e) heating the supported particle mass in a low pressure environment to a temperature and for a time sufficient to fuse the particles together and volatilize a substantial portion of the alkali metal contaminants present in said mass.

2. The method of claim 1, wherein said mixture is compacted during step (c) by a pressure on said movable wall section of at least 13,000 pounds per square inch.

3. The method of claim 1, wherein said particle mass is heated during step (e) to a temperature of at least 1250° C. for a period of at least four hours.

4. The method of claim 1, wherein the titanium and tungsten particles forming the mixture are present in a weight ratio of about 10% titanium and 90% tungsten.

5. A sputtering target manufactured by the method of claim 1.

6. A method of manufacturing a sintered titanium-tungsten alloy sputtering target having a reduced level of sodium contamination, comprising the subsequential steps of:
   (a) providing a die having a cavity of a desired configuration, said cavity having a relatively flexible movable wall section,
   (b) charging said cavity with a mixture of finely-divided titanium and tungsten particles, said mixture containing as an impurity an undesirably high concentration of sodium,
   (c) compacting said particle mixture into a coherent mass by the application of substantially uniform surface pressure to said movable wall section,
   (d) transferring the compacted particle mass to a temperature-resistant support, and
   (e) heating the supported particle mass in a low pressure environment to a temperature of at least 1250° C. for a period of at least four hours to fuse the particles together and volatilize at least a portion of said sodium.

7. The method of claim 6, wherein said particle mass during step (e) is heated at an atmospheric pressure not greater than $10^{-6}$ torr to a temperature of at least 1250° C. for a period of at least four hours, then to a temperature of at least 1350° C. for a period of approximately one-half hour while maintaining said pressure.

* * * * *